(12) United States Patent
Hayes et al.

(10) Patent No.: US 8,445,776 B2
(45) Date of Patent: May 21, 2013

(54) SOLAR CELL MODULE HAVING A LOW HAZE ENCAPSULANT LAYER

(75) Inventors: Richard Allen Hayes, Beaumont, TX (US); Rebecca L. Smith, Vienna, WV (US); Kristof Proost, Hemiksem (BE); Steven C. Pesek, Orange, TX (US); Charles Anthony Smith, Vienna, WV (US)

(73) Assignee: E I du Pont de Nemours and Company, Wilmington, DE (US)

( * ) Notice: Subject to any disclaimer, the term of this patent is extended or adjusted under 35 U.S.C. 154(b) by 688 days.

(21) Appl. No.: 12/475,776

(22) Filed: Jun. 1, 2009

(65) Prior Publication Data

US 2010/0108125 A1    May 6, 2010

Related U.S. Application Data

(60) Provisional application No. 61/130,747, filed on Jun. 2, 2008.

(51) Int. Cl.
| | |
|---|---|
| *H01L 25/00* | (2006.01) |
| *H01L 31/042* | (2006.01) |
| *B32B 37/02* | (2006.01) |
| *C08F 220/06* | (2006.01) |
| *C08F 118/02* | (2006.01) |

(52) U.S. Cl.
USPC ............. 136/251; 136/244; 156/300; 156/60; 156/285; 526/317.1; 526/318; 526/319

(58) Field of Classification Search ............. 136/251, 136/244; 156/300, 60, 285; 526/317.1, 318, 526/319
See application file for complete search history.

(56) References Cited

U.S. PATENT DOCUMENTS

| | | | |
|---|---|---|---|
| 2,632,921 | A | 3/1953 | Kreidl |
| 2,648,097 | A | 8/1953 | Kritchever |

(Continued)

FOREIGN PATENT DOCUMENTS

| | | |
|---|---|---|
| EP | 1857500 A1 | 11/2007 |
| EP | 1863098 A1 | 12/2007 |

(Continued)

OTHER PUBLICATIONS

International Seach Report and the Written Opinion of the International Seaching Authority, or the Declaration, May 19, 2010, PCT/US2009/045806.

(Continued)

*Primary Examiner* — Michael M Bernshteyn
(74) *Attorney, Agent, or Firm* — Maria M. Kourtakis; Kelly Law Registry; Tong T. Li

(57) ABSTRACT

A solar cell module comprising a solar cell layer and a sheet comprising at least one layer of a sodium ionomer composition, wherein the sodium ionomer composition consists essentially of a sodium ionomer that is an ionic, neutralized derivative of a precursor α-olefin carboxylic acid copolymer, wherein about 10% to about 35% of the total content of the carboxylic acid groups present in the precursor α-olefin carboxylic acid copolymer have been neutralized with sodium ions, and wherein the precursor α-olefin carboxylic acid copolymer comprises (i) copolymerized units of an α-olefin having 2 to 10 carbons and (ii) about 20 to about 25 wt %, based on the total weight of the α-olefin carboxylic acid copolymer, of copolymerized units of an α,β-ethylenically unsaturated carboxylic acid having 3 to 8.

27 Claims, 1 Drawing Sheet

U.S. PATENT DOCUMENTS

| | | | |
|---|---|---|---|
| 2,683,894 | A | 7/1954 | Kritchever |
| 2,704,382 | A | 3/1955 | Kreidl |
| 3,344,014 | A | 9/1967 | Rees |
| 3,404,134 | A | 10/1968 | Rees |
| 3,762,988 | A | 10/1973 | Clock et al. |
| 4,035,549 | A | 7/1977 | Kennar |
| 4,663,228 | A | 5/1987 | Bolton et al. |
| 4,668,574 | A | 5/1987 | Bolton et al. |
| 4,732,814 | A | 3/1988 | Hatada et al. |
| 4,799,346 | A | 1/1989 | Bolton et al. |
| 4,865,711 | A | 9/1989 | Kittler |
| 5,028,674 | A | 7/1991 | Hatch et al. |
| 5,411,845 | A | 5/1995 | Robinson |
| 5,415,942 | A | 5/1995 | Anderson |
| 5,476,553 | A | 12/1995 | Hanoka et al. |
| 5,478,402 | A | 12/1995 | Hanoka |
| 5,507,881 | A | 4/1996 | Sichanugrist et al. |
| 5,512,107 | A | 4/1996 | van den Berg |
| 5,690,994 | A | 11/1997 | Robinson |
| 5,698,329 | A | 12/1997 | Robinson |
| 5,733,382 | A | 3/1998 | Hanoka |
| 5,741,370 | A | 4/1998 | Hanoka |
| 5,759,698 | A | 6/1998 | Tanuma et al. |
| 5,762,720 | A | 6/1998 | Hanoka et al. |
| 5,763,062 | A | 6/1998 | Smith et al. |
| 5,770,312 | A | 6/1998 | Robinson |
| 5,895,721 | A | 4/1999 | Naoumenko et al. |
| 5,948,176 | A | 9/1999 | Ramanathan et al. |
| 5,986,203 | A | 11/1999 | Hanoka et al. |
| 5,994,163 | A | 11/1999 | Bodegård et al. |
| 6,040,521 | A | 3/2000 | Kushiya et al. |
| 6,114,046 | A | 9/2000 | Hanoka |
| 6,137,048 | A | 10/2000 | Wu et al. |
| 6,150,028 | A | 11/2000 | Mazon |
| 6,187,448 | B1 | 2/2001 | Hanoka et al. |
| 6,258,620 | B1 | 7/2001 | Morel et al. |
| 6,320,116 | B1 | 11/2001 | Hanoka |
| 6,353,042 | B1 | 3/2002 | Hanoka et al. |
| 6,432,522 | B1 | 8/2002 | Friedman et al. |
| 6,500,888 | B2 | 12/2002 | Baumgartner et al. |
| 6,514,425 | B1 | 2/2003 | Sekiya et al. |
| 6,518,365 | B1 | 2/2003 | Powell et al. |
| 6,660,930 | B1 | 12/2003 | Gonsiorawski |
| 6,689,821 | B2 | 2/2004 | Na et al. |
| 2002/0155302 | A1 | 10/2002 | Smith et al. |
| 2003/0000568 | A1 | 1/2003 | Gonsiorawski |
| 2003/0098059 | A1* | 5/2003 | Hanoka ............... 136/251 |
| 2004/0144415 | A1 | 7/2004 | Arhart |
| 2005/0089692 | A1 | 4/2005 | Anderson |
| 2005/0279401 | A1 | 12/2005 | Arhart et al. |
| 2006/0084763 | A1 | 4/2006 | Arhart et al. |
| 2006/0141212 | A1 | 6/2006 | Smith et al. |
| 2006/0182983 | A1 | 8/2006 | Paul et al. |
| 2006/0265929 | A1 | 11/2006 | Haney |
| 2007/0079866 | A1 | 4/2007 | Borden et al. |
| 2007/0092706 | A1 | 4/2007 | Pesek et al. |
| 2007/0122633 | A1 | 5/2007 | Pesek et al. |
| 2007/0154694 | A1 | 7/2007 | Samuels et al. |
| 2007/0196630 | A1 | 8/2007 | Hayes et al. |
| 2007/0209699 | A1 | 9/2007 | Sichanugrist et al. |
| 2007/0221268 | A1 | 9/2007 | Hasch |
| 2007/0227578 | A1 | 10/2007 | Perozziello et al. |
| 2007/0228340 | A1 | 10/2007 | Hayes et al. |
| 2007/0232057 | A1 | 10/2007 | Borden et al. |
| 2007/0238285 | A1 | 10/2007 | Borden |
| 2007/0240759 | A1 | 10/2007 | Borden |
| 2007/0267059 | A1 | 11/2007 | Nishijima et al. |
| 2007/0281090 | A1 | 12/2007 | Kurita et al. |
| 2007/0289693 | A1 | 12/2007 | Anderson et al. |
| 2007/0298590 | A1 | 12/2007 | Choi et al. |
| 2008/0017241 | A1 | 1/2008 | Anderson et al. |
| 2008/0023063 | A1 | 1/2008 | Hayes et al. |
| 2008/0023064 | A1 | 1/2008 | Hayes et al. |
| 2008/0053516 | A1 | 3/2008 | Hayes |
| 2008/0099064 | A1 | 5/2008 | Hayes |
| 2008/0190481 | A1 | 8/2008 | Hayes et al. |
| 2008/0196760 | A1 | 8/2008 | Hayes et al. |
| 2008/0199690 | A1 | 8/2008 | Hayes et al. |
| 2008/0264471 | A1 | 10/2008 | Hayes |
| 2008/0264481 | A1 | 10/2008 | Hayes |
| 2009/0126781 | A1 | 5/2009 | Hayes et al. |
| 2009/0151772 | A1 | 6/2009 | Hayes et al. |
| 2009/0183773 | A1 | 7/2009 | Samuels et al. |

FOREIGN PATENT DOCUMENTS

| | | |
|---|---|---|
| EP | 1990840 A1 | 11/2008 |
| JP | 2000-186114 A | 7/2000 |
| JP | 2000186114 A * | 7/2000 |
| WO | WO99/58334 A2 | 11/1999 |
| WO | WO00/06619 A1 | 2/2000 |
| WO | WO2006/057771 A2 | 6/2006 |
| WO | WO2006/070793 A1 | 7/2006 |
| WO | WO2006/085603 A1 | 8/2006 |
| WO | WO2006/095762 A1 | 9/2006 |
| WO | WO2006/095911 A1 | 9/2006 |
| WO | WO2007/094445 A1 | 8/2007 |
| WO | WO2007/149082 A1 | 12/2007 |

OTHER PUBLICATIONS

DuPont™ SentryGlas® Plus Architectural Safety Glass brochure (2005).
DuPont™ SentryGlas® Plus Edge Stability Results—Seven Year Test (2005).
DuPont™ SentryGlas® Plus Interlayer, Technical Bulletin—Strength Characteristics (2005).
DuPont™ SentryGlas® Plus Interlayer, Technical Bulletin—Weathering (2005).
DuPont™ SentryGlas® Plus Interlayer, Technical Bulletin—Sealant Compatibility (2005).
DuPont™ SentryGlas® Plus Interlayer, Technical Bulletin—Ultra-Violet Radiation Control (2005).
DuPont™ SentryGlas® Plus Interlayer, Technical Bulletin—Solar Control (2005).
DuPont™ SentryGlas® Plus Interlayer, Technical Bulletin—Visual Quality (2005).
DuPont™ SentryGlas® Plus Interlayer, Technical Bulletin—Post-Glass Breakage Peformance (2005).
Lenges, DuPont Photovoltaic Solutions, Encapsulation Technologies (2006).
DuPont Encapsulation Offerings, Resin Versus Interlayer Options (2007).
DuPont Encapsulation Offerings, Resins (2007).
DuPont™ SentryGlas® Plus Interlayers, Interlayer Options for Solar Encapsulation (2006).
DuPont Encapsulation Offerings, DuPont™ SentryGlas® Plus Interlayers, Options for Solar Cell Encapsulation—SentryGlas® Plus (2007).
News Release, DuPont Solar Program Advances the Science of Renewable Energy (Apr. 2006).
Photovoltaic Solutions, News, DuPont Showcases its Photovoltaic Solutions at Leading European Conference and Exhibition (Jun. 2005).
ASTM D 1238—04c, (May 2008).
Safety Standard ANSI/SAE Z26.1-1966: American National Standard for Safety Glazing Materials for Glazing Motor Vehicles and Motor Vehicle Equipment Operating on Land Highways.

* cited by examiner

SOLAR CELL MODULE HAVING A LOW HAZE ENCAPSULANT LAYER

CROSS-REFERENCE TO RELATED APPLICATIONS

This application claims priority from U.S. Patent Application Ser. No. 61/130,747, filed on Jun. 2, 2008, which is incorporated herein by reference.

FIELD OF THE INVENTION

The present invention is directed to solar cell modules having encapsulant sheet layers that exhibit a low degree of haze. In particular, the present invention relates to solar cell modules comprising an encapsulant sheet comprising at least one layer of a sodium ionomer composition.

BACKGROUND OF THE INVENTION

Because they provide a sustainable energy resource, the use of solar cells is rapidly expanding. Solar cells can typically be categorized into two types based on the light absorbing material used, i.e., bulk or wafer-based solar cells and thin film solar cells.

Monocrystalline silicon (c-Si), poly- or multi-crystalline silicon (poly-Si or mc-Si) and ribbon silicon are the materials used most commonly in forming the more traditional wafer-based solar cells. Solar cell modules derived from wafer-based solar cells often comprise a series of self-supporting wafers (or cells) that are soldered together. The wafers generally have a thickness of between about 180 and about 240 µm. Such a panel of solar cells is called a solar cell layer and it may further comprise electrical wirings such as cross ribbons connecting the individual cell units and bus bars having one end connected to the cells and the other exiting the module. The solar cell layer is then further laminated to encapsulant layer(s) and protective layer(s) to form a weather resistant module that may be used for up to 25 to 30 years. In general, a solar cell module derived from wafer-based solar cell(s) comprises, in order of position from the front light-receiving side to the back non-light-receiving side: (1) an incident layer, (2) a front encapsulant layer, (3) a solar cell layer, (4) a back encapsulant layer, and (5) a backing layer.

The increasingly important alternative thin film solar cells are commonly formed from materials that include amorphous silicon (a-Si), microcrystalline silicon (µc-Si), cadmium telluride (CdTe), copper indium selenide (CuInSe2 or CIS), copper indium/gallium diselenide (CuInxGa(1-x)Se2 or CIGS), light absorbing dyes, and organic semiconductors. By way of example, thin film solar cells are disclosed in e.g., U.S. Pat. Nos. 5,507,881; 5,512,107; 5,948,176; 5,994,163; 6,040,521; 6,137,048; and 6,258,620 and U.S. Patent Publication Nos. 20070298590; 20070281090; 20070240759; 20070232057; 20070238285; 20070227578; 20070209699; and 20070079866. Thin film solar cells with a typical thickness of less than 2 µm are produced by depositing the semiconductor layers onto a superstrate or substrate formed of glass or a flexible film. During manufacture, it is common to include a laser scribing sequence that enables the adjacent cells to be directly interconnected in series, with no need for further solder connections between cells. As with wafer cells, the solar cell layer may further comprise electrical wirings such as cross ribbons and bus bars. Similarly, the thin film solar cells are further laminated to other encapsulant and protective layers to produce a weather resistant and environmentally robust module. Depending on the sequence in which the multi-layer deposition is carried out, the thin film solar cells may be deposited on a superstrate that ultimately serves as the incident layer in the final module, or the cells may be deposited on a substrate that ends up serving as the backing layer in the final module. Therefore, a solar cell module derived from thin film solar cells may have one of two types of construction. The first type includes, in order of position from the front light-receiving side to the back non-light-receiving side, (1) a solar cell layer comprising a superstrate and a layer of thin film solar cell(s) deposited thereon at the non-light-receiving side, (2) a (back) encapsulant layer, and (3) a backing layer. The second type may include, in order of position from the front light-receiving side to the back non-light-receiving side, (1) an incident layer, (2) a (front) encapsulant layer, (3) a solar cell layer comprising a layer of thin film solar cell(s) deposited on a substrate at the light-receiving side thereof.

The encapsulant layers used in solar cell modules are designed to encapsulate and protect the fragile solar cells. Suitable polymer materials for solar cell encapsulant layers typically possess a combination of characteristics such as high impact resistance, high penetration resistance, good ultraviolet (UV) light resistance, good long term thermal stability, adequate adhesion strength to glass and other rigid polymeric sheets, high moisture resistance, and good long term weatherability. In addition, the front encapsulant layers should be transparent enough to allow sunlight to effectively reach the solar cells to permit the solar cells to generate the highest power output possible. Thus, it is very desirable that the polymer materials utilized in the front encapsulant layers exhibit a combination of low haze and high clarity.

Ionomers are polymers produced by partially or fully replacing the hydrogen atoms of the acid moieties of precursor (also known as "parent") acid copolymers with ionic moieties. This is generally accomplished by neutralizing the parent acid copolymers, for example copolymers comprising copolymerized units of $\alpha$-olefins and $\alpha,\beta$-ethylenically unsaturated carboxylic acids. Neutralization of the carboxylic acid groups present in such parent or precursor copolymers is generally effected by reaction of the copolymer with a base, e.g. sodium hydroxide or magnesium hydroxide, whereby the hydrogen atoms of the carboxylic acids are replaced by the cations of the base. The ionomers thus formed are ionic, fully or partially neutralized compositions that comprise carboxylate groups having cations derived from reaction of the carboxylic acid with the base. Ionomers are well known in the art and include polymers wherein the cations of the carboxylate groups of the ionomer are metal cations, including alkali metal cations, alkaline earth cations and transition metal cations. Commercially available ionomers include those having sodium, magnesium, aluminum, zinc and iron cations.

The use of ionomer compositions in laminated safety glass as interlayers is known in the art. See, e.g., U.S. Pat. Nos. 3,344,014; 3,762,988; 4,663,228; 4,668,574; 4,799,346; 5,759,698; 5,763,062; 5,895,721; 6,150,028; and 6,432,522, U.S. Patent Publication Nos. 20020155302; 20020155302; 20060182983; 20070092706; 20070122633; 20070289693, and PCT Patent Publication Nos. WO9958334; WO2006057771 and WO2007149082.

In recent years, certain ionomer compositions have also been developed as solar cell encapsulant materials. See, e.g., U.S. Pat. Nos. 5,476,553; 5,478,402; 5,733,382; 5,741,370; 5,762,720; 5,986,203; 6,114,046; 6,187,448; 6,353,042; 6,320,116; and 6,660,930, and U.S. Patent publication Nos. 20030000568 and 20050279401. For example, U.S. Pat. No. 5,476,553 discloses the use, among others, of sodium ionomers such as Surlyn® 1601 resin as an encapsulant material. U.S. Pat. No. 6,114,046 discloses a multi-layer metallocene polyolefin/ionomer laminate structure that can be used as an encapsulant. Various types of ionomers, including sodium and zinc ionomers, are described.

The transparency of ionomer encapsulants currently used as well as those disclosed in the art is not optimum. It would be desirable to have available ionomer compositions of greater transparency so that production of solar cells capable of generating higher power output would be possible.

SUMMARY OF THE INVENTION

The invention provides a solar cell module comprising a solar cell layer and a sheet comprising at least one layer of a sodium ionomer composition, wherein (a) the solar cell layer is selected from the group consisting of solar cell layers comprising a single solar cell and solar cell layers comprising a plurality of electrically interconnected solar cells; (b) the solar cell layer has a light-receiving side and a non-light-receiving side; and (c) the sodium ionomer composition consists essentially of a sodium ionomer that is an ionic, neutralized derivative of a precursor α-olefin carboxylic acid copolymer, wherein about 10% to about 35% of the total content of the carboxylic acid groups present in the precursor α-olefin carboxylic acid copolymer have been neutralized with sodium ions, and wherein the precursor α-olefin carboxylic acid copolymer comprises (i) copolymerized units of an α-olefin having 2 to 10 carbons and (ii) about 20 to about 25 wt %, based on the total weight of the α-olefin carboxylic acid copolymer, of copolymerized units of an α,β-ethylenically unsaturated carboxylic acid having 3 to 8 carbons.

In one particular embodiment, the solar cell module consists essentially of, in order of position, (i) an incident layer, (ii) a front encapsulant layer laminated to the light-receiving side of the solar cell layer, (iii) the solar cell layer, (iv) a back encapsulant layer laminated to the non-light receiving side of the solar cell layer, and (v) a backing layer, wherein one of the front and back encapsulant layers is the sheet comprising the sodium ionomer composition.

In a further embodiment, the solar cell module consists essentially of, in order of position, (i) an incident layer, (ii) a front encapsulant layer comprising a sheet having at least one layer of the sodium ionomer composition, and (iii) a thin film solar cell layer, wherein the solar cell layer further comprises a substrate upon which the thin film solar cells are deposited and the substrate is positioned such that the substrate is an outermost surface of the module and is positioned on the non-light-receiving side of the solar cell layer.

In yet a further embodiment, the solar cell module consists essentially of, in order of position (i) a thin film solar cell layer, (ii) a back encapsulant layer comprising the sheet having at least one layer of the sodium ionomer composition, and (iii) a backing layer, wherein the solar cell layer further comprises a superstrate upon which the thin film solar cells are deposited and the superstrate is positioned such that the superstrate is an outermost surface of the module on the light-receiving side of the solar cell layer.

The invention further provides a process for preparing a solar cell module, comprising:

(i) providing an assembly comprising a solar cell layer and a sheet having at least one layer of a sodium ionomer composition, wherein (a) the solar cell layer is selected from the group consisting of solar cell layers comprising a single solar cell and solar cell layers comprising a plurality of electrically interconnected solar cells; (b) the solar cell layer has a light-receiving side and a non-light-receiving side; and (c) the sodium ionomer composition consists essentially of a sodium ionomer that is an ionic, neutralized derivative of a precursor α-olefin carboxylic acid copolymer, wherein about 10% to about 35% of the total content of the carboxylic acid groups present in the precursor α-olefin carboxylic acid copolymer have been neutralized with sodium ions, and wherein the precursor α-olefin carboxylic acid copolymer comprises (i) copolymerized units of an α-olefin having 2 to 10 carbons and (ii) about 20 to about 25 wt %, based on the total weight of the α-olefin carboxylic acid copolymer, of copolymerized units of an α,β-ethylenically unsaturated carboxylic acid having 3 to 8 carbons and (ii) laminating the assembly to form the solar cell module.

DETAILED DESCRIPTION OF THE INVENTION

Figure 1:
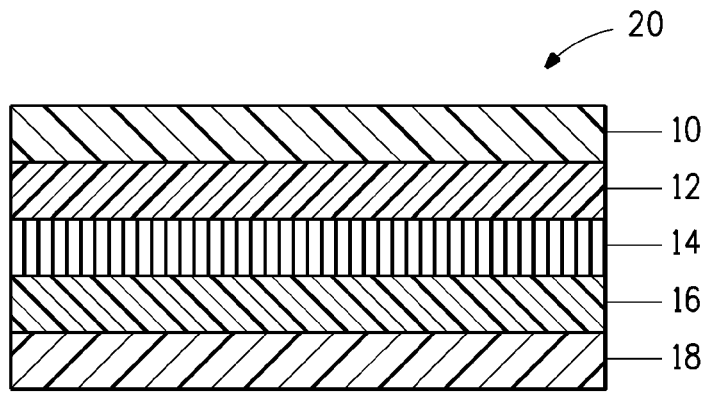
FIG. 1 is a cross-sectional view, not-to-scale, of a wafer-based solar cell module disclosed herein.

Unless otherwise defined, all technical and scientific terms used herein have the same meaning as commonly understood by one of ordinary skill in the art to which this invention belongs. In case of conflict, the specification, including definitions, will control.

Although methods and materials similar or equivalent to those described herein can be used in the practice or testing of the invention, suitable methods and materials are described herein.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

When the term "about" is used in describing a value or an end-point of a range, the disclosure should be understood to include the specific value or end-point referred to.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

The transitional phrase "consisting essentially of" limits the scope of a claim to the specified materials or steps and those that do not materially affect the basic and novel characteristic(s) of the claimed invention.

Where applicants have defined an invention or a portion thereof with an open-ended term such as "comprising," it should be readily understood that unless otherwise stated the description should be interpreted to also describe such an invention using the term "consisting essentially of".

Use of "a" or "an" are employed to describe elements and components of the invention. This is merely for convenience and to give a general sense of the invention. This description should be read to include one or at least one and the singular also includes the plural unless it is obvious that it is meant otherwise.

In describing certain polymers it should be understood that sometimes applicants are referring to the polymers by the monomers used to produce them or the amounts of the monomers used to produce the polymers. While such a description may not include the specific nomenclature used to describe the final polymer or may not contain product-by-process terminology, any such reference to monomers and amounts should be interpreted to mean that the polymer comprises those monomers (i.e. copolymerized units of those monomers) or that amount of the monomers, and the corresponding polymers and compositions thereof.

In describing and/or claiming this invention, the term "copolymer" is used to refer to polymers formed by copolymerization of two or more monomers. Such copolymers include dipolymers, terpolymers or higher order copolymers.

The term "acid copolymer" as used herein refers to a polymer comprising copolymerized units of an α-olefin, an α,β-ethylenically unsaturated carboxylic acid, and optionally other suitable comonomer(s) such as, an α,β-ethylenically unsaturated carboxylic acid ester.

The term "ionomer" as used herein refers to a polymer that comprises ionic groups that are metal ion carboxylates, for example, alkali metal carboxylates, alkaline earth carboxylates, transition metal carboxylates and/or mixtures of such carboxylates. Such polymers are generally produced by partially or fully neutralizing the carboxylic acid groups of a precursor or "parent" polymer that is an acid copolymer, as defined herein, for example by reaction with a base. An example of an alkali metal ionomer as used herein is a sodium ionomer (or sodium neutralized ionomer), for example a copolymer of ethylene and methacrylic acid wherein all or a portion of the carboxylic acid groups of the copolymerized methacrylic acid units are in the form of sodium carboxylates.

The invention provides a solar cell module comprising a) at least one layer that is a sheet comprising at least one layer of a sodium ionomer composition and b) a solar cell layer comprised of one or a plurality of solar cells. The sheet functions as an encapsulant layer in the solar cell module. That is, in the solar cell modules of the present invention are characterized by having an encapsulant layer having at least one layer of a sodium ionomer composition.

The sodium ionomer compositions used herein consist essentially of sodium ionomers that are ionic, neutralized derivatives of a precursor acid copolymer comprising copolymerized units of an α-olefin having 2 to 10 carbons and about 20 to about 25 wt %, or preferably about 21 to about 23 wt %, of copolymerized units of an α,β-ethylenically unsaturated carboxylic acid having 3 to 8 carbons.

Suitable α-olefin comonomers may include, but are not limited to, ethylene, propylene, 1-butene, 1-pentene, 1-hexene, 1-heptene, 3 methyl-1-butene, 4-methyl-1-pentene, and the like and mixtures of two or more thereof. Preferably, the α-olefin is ethylene.

Suitable α,β-ethylenically unsaturated carboxylic acid comonomers may include, but are not limited to, acrylic acids, methacrylic acids, itaconic acids, maleic acids, maleic anhydrides, fumaric acids, monomethyl maleic acids, and mixtures of two or more thereof. Preferably, the α,β-ethylenically unsaturated carboxylic acid is selected from acrylic acids, methacrylic acids, and mixtures of two or more thereof.

The precursor acid copolymers may further comprise copolymerized units of other comonomer(s), such as unsaturated carboxylic acids having 2 to 10, or preferably 3 to 8 carbons, or derivatives thereof. Suitable acid derivatives include acid anhydrides, amides, and esters. Esters are preferred. Specific examples of preferred esters of unsaturated carboxylic acids include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol)acrylates, poly(ethylene glycol)methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly (ethylene glycol) 4-nonylphenyl ether methacrylates, poly (ethylene glycol) phenyl ether acrylates, poly(ethylene glycol) phenyl ether methacrylates, dimethyl maleates, diethyl maleates, dibutyl maleates, dimethyl fumarates, diethyl fumarates, dibutyl fumarates, dimethyl fumarates, vinyl acetates, vinyl propionates, and mixtures of two or more thereof. Examples of preferable suitable comonomers include, but are not limited to, methyl acrylates, methyl methacrylates, butyl acrylates, butyl methacrylates, glycidyl methacrylates, vinyl acetates, and mixtures of two or more thereof. Preferably, however, the precursor acid copolymer does not incorporate other comonomers.

The precursor acid copolymers may be polymerized as disclosed in U.S. Pat. Nos. 3,404,134; 5,028,674; 6,500,888; and 6,518,365. Preferably, the precursor acid copolymers are polymerized under process conditions such that short chain and long chain branching is maximized. Such processes are disclosed in, e.g., P. Ehrlich and G. A. Mortimer, "Fundamentals of Free-Radical Polymerization of Ethylene", *Adv. Polymer Sci.*, Vol. 7, p. 386-448 (1970) and J. C. Woodley and P. Ehrlich, "The Free Radical, High Pressure Polymerization of Ethylene II. The Evidence For Side Reactions from Polymer Structure and Number Average Molecular Weights", *J. Am. Chem. Soc.*, Vol. 85, p. 1580-1854.

To obtain the sodium ionomers (i.e. sodium neutralized ionomers) useful in the sodium ionomer compositions of the encapsulant component, the precursor acid copolymers are neutralized with for example a sodium ion-containing base to provide an ionomer wherein about 10% to about 35%, or preferably about 15% to about 30%, of the hydrogen atoms of carboxylic acid groups of the precursor acid are replaced by sodium cations. That is, the acid groups are neutralized to a level of about 10% to about 35%, or preferably about 15% to about 30%, based on the total carboxylic acid content of the precursor acid copolymers as calculated or measured for the non-neutralized precursor acid copolymers. The more preferable and most preferable neutralization ranges make it possible to obtain an ionomer sheet with the desirable end use properties that are novel characteristics of the compositions of the invention, such as low haze, high clarity and sufficient impact resistance while still maintaining optimized melt flow for the sheet formation process. Ionomers that comprise cations other than sodium can have a deleterious effect on the clarity and low haze properties that are characteristics of the encapsulant layers useful in the present invention. Therefore, it is preferred that ionomeric species other than sodium ionomers are not present in the ionomer compositions or if present, that they are present in concentrations of less than 5 per hundred parts of the sodium ionomer composition.

The precursor acid copolymers may be neutralized as disclosed, for example, in U.S. Pat. No. 3,404,134.

The precursor acid copolymer may have a melt flow rate (MFR) of about 60 g/10 min or less, preferably about 45 g/10 min or less, more preferably about 30 g/10 min or less, and most preferably about 25 g/10 min or less, as determined in accordance with ASTM method D1238 at 190° C. and 2.16 kg. The sodium ionomer preferably has a MFR of about 10 g/10 min or less, more preferably about 5 g/10 min or less, and most preferably about 3 g/10 min or less. The sodium ionomer may also preferably have a flexural modulus greater than about 40,000 psi (276 MPa), more preferably greater than about 50,000 psi (345 MPa), and most preferably greater than about 60,000 psi (414 MPa), as determined in accordance with ASTM method D638.

Polymeric sheets comprising such sodium ionomers exhibit greater toughness, lower haze, and higher transparency relative to that which would be expected of an ionomeric sheet comprising an ionomer having a high carboxylic acid content. Without being held to any particular theory, it is believed that the relatively low MFR associated with the precursor acid copolymer and the particular cation of the neutralizing agent (i.e., sodium) contributes to the improvement in toughness and transparency and the reduction on haze. Some exemplary sodium ionomers useful in the practice of the invention are also disclosed in U.S. Patent Publication No. 20060182983.

The sodium ionomer compositions useful as polymeric sheets may further contain additives which would not affect the optical properties of the sheets. For example, the sodium ionomer compositions may contain additives which effectively reduce the melt flow of the resin, and may be present in any amount that permits production of thermoset films or sheets. The use of such additives will enhance the upper end-use temperature and reduce creep of the solar cell encapsulants derived therefrom. Typically, the end-use temperature may be enhanced up to about 20° C. to about 70° C. In addition, solar cell modules comprising such materials will be fire resistant. Specifically, by thermosetting the ionomeric resins during lamination, the resins will have a reduced tendency to melt and flow out of the laminate, which in turn, could reduce the available fuel in a fire situation.

Typical effective melt flow reducing additives are organic peroxides, such as 2,5-dimethylhexane-2,5-dihydroperoxide, 2,5-dimethyl-2,5-di(tert-butylperoxy)hexane-3, di-tert-butyl peroxide, tert-butylcumyl peroxide, 2,5-dimethyl-2,5-di(tert-butylperoxy)hexane, dicumyl peroxide, alpha, alpha'-bis(tert-butyl-peroxyisopropyl)benzene, n-butyl-4,4-bis(tert-butylperoxy)valerate, 2,2-bis(tert-butylperoxy)butane, 1,1-bis(tert-butyl-peroxy)cyclohexane, 1,1-bis(tert-butylperoxy)-3,3,5-trimethyl-cyclohexane, tert-butyl peroxybenzoate, benzoyl peroxide, and the like and mixtures combinations thereof. Preferably the organic peroxides decompose at a temperature of about 100° C. or higher to generate radicals. More preferably, the organic peroxides have a decomposition temperature which affords a half life of 10 hours at about 70° C. or higher to provide improved stability for blending operations. The organic peroxides may be added at a level of about 0.01 to about 10 wt %, or preferably, about 0.5 to about 3 wt %, based on the total weight of the sodium ionomer composition.

If desired, initiators, such as dibutyltin dilaurate, may also be present in the ionomeric composition at a level of about 0.01 to about 0.05 wt %, based on the total weight of the sodium ionomer composition. In addition, if desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 wt %, based on the total weight of the composition.

However, for the sake of process simplification and ease, it is preferred that the sodium ionomer compositions do not incorporate cross-linking additives, such as the abovementioned peroxides.

The sodium ionomer composition may also contain other additives known within the art. The additives may include, but are not limited to, processing aids, flow enhancing additives, lubricants, pigments, dyes, flame retardants, impact modifiers, nucleating agents, anti-blocking agents such as silica, thermal stabilizers, UV absorbers, UV stabilizers, dispersants, surfactants, chelating agents, coupling agents, reinforcement additives, such as glass fiber, fillers and the like. Generally, additives that may reduce the optical clarity of the composition, such as reinforcement additives and fillers, are reserved for those sheets that are used as the back encapsulants.

Thermal stabilizers can be used and have been widely disclosed within the art. Any known thermal stabilizer may find utility within the invention. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds that destroy peroxide, hydroxylamines, nitrones, thiosynergists, benzofuranones, indolinones, and the like and mixtures thereof. The sodium ionomer composition may contain any effective amount of thermal stabilizers. Use of a thermal stabilizer is optional and in some instances is not preferred. When thermal stabilizers are used, the sodium ionomer composition contains at least about 0.05 wt %, and up to about 10 wt %, more preferably up to about 5 wt %, and most preferably up to about 1 wt %, of thermal stabilizers, based on the total weight of the ionomer composition.

UV absorbers can be used and have also been widely disclosed within the art. Any known UV absorber may find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The sodium ionomer composition may contain any effective amount of UV absorbers. Use of a UV absorber is optional and in some instances is not preferred. When UV absorbers are utilized, the sodium ionomer composition contains at least about 0.05 wt %, and up to about 10 wt %, more preferably up to about 5 wt %, and most preferably up to about 1 wt %, of UV absorbers, based on the total weight of the ionomer composition.

Hindered amine light stabilizers (HALS) can be used and have also been widely disclosed within the art. Generally, hindered amine light stabilizers are disclosed to be secondary, tertiary, acetylated, N-hydrocarbyloxy substituted, hydroxy substituted N-hydrocarbyloxy substituted, or other substituted cyclic amines which are characterized by a substantial amount of steric hindrance, generally derived from aliphatic substitution on the carbon atoms adjacent to the amine function. The sodium ionomer composition may contain any effective amount of hindered amine light stabilizers. Use of hindered amine light stabilizers is optional and in some instances is not preferred. When hindered amine light stabilizers are used, the sodium ionomer composition contains at least about 0.05 wt %, and up to about 10 wt %, more preferably up to about 5 wt %, and most preferably, up to about 1 wt %, of hindered amine light stabilizers, based on the total weight of the ionomer composition.

Silane coupling agents may be added to the sodium ionomer composition to improve its adhesive strength. Exemplary silane coupling agents that are useful in the compositions of the invention include, but are not limited to, γ-chloropropylmethoxysilane, vinyltrimethoxysilane, vinyltriethoxysilane, vinyltris(β-methoxyethoxy)silane, γ-vinylbenzylpropyltrimethoxysilane, N-β-(N-vinylbenzylaminoethyl)-γ-aminopropyltrimethoxysilane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltrimethoxysilane, vinyltrichlorosilane, γ-mercaptopropylmethoxysilane, γ-aminopropyltriethoxysilane, N-β-(aminoethyl)-γ-aminopropyltrimethoxysilane, and mixtures of two or more thereof. The silane coupling agents are preferably incorporated in the sodium ionomer composition at a level of about 0.01 to about 5 wt %, or more preferably about 0.05 to about 1 wt %, based on the total weight of the ionomer composition.

The sheet that functions as one component of the solar modules of the invention may be in a single layer or in multilayer form. By "single layer", it is meant that the sheet is made of or consists essentially of the sodium ionomer composition. When in a multilayer form, at least one of the sublayers is made of or consists essentially of the sodium ionomer composition, while the other sub-layer(s) may be made of any other suitable polymeric material(s), such as, for example, acid copolymers as previously defined herein, ionomers as previously defined herein, poly(ethylene vinyl acetates), poly(vinyl acetals) (including acoustic grade poly(vinyl acetals)), polyurethanes, polyvinylchlorides, polyethylenes (e.g., linear low density polyethylenes), polyolefin block elastomers, copolymers of α-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof.

The total thickness of the sheet that comprises at least one layer of the sodium ionomer composition may be in the range of about 10 to about 90 mil (about 0.25 to about 2.3 mm), preferably about 10 to about 60 mil (about 0.25 to about 1.5 mm), more preferably about 15 to about 55 mil (about 0.38 to about 1.4 mm), yet more preferably about 15 to about 45 mil (about 0.38 to about 1.14 mm), yet more preferably about 15 to about 35 mil (about 0.38 to about 0.89 mm), and most preferably about 25 to about 35 mil (about 0.64 to about 0.89 mm). The thickness of the individual film and sheet components which make up the total multilayer encapsulant layer is not critical and may be independently varied depending on the particular application.

The sheet comprising the sodium ionomer composition may have a smooth or rough surface on one or both sides. Preferably, the sheet has rough surfaces on both sides to facilitate deaeration during the lamination process. Rough surfaces can be created by mechanically embossing or by melt fracture during extrusion of the sheets followed by quenching so that surface roughness is retained during handling. The surface pattern can be applied to the sheet through common art processes. For example, the as-extruded sheet may be passed over a specially prepared surface of a die roll positioned in close proximity to the exit of the die which imparts the desired surface characteristics to one side of the molten polymer. Thus, when the surface of such a die roll has minute peaks and valleys, the polymer sheet cast thereon will have a rough surface on the side that is in contact with the roll, and the rough surface generally conforms respectively to the valleys and peaks of the roll surface. Such die rolls are disclosed in, e.g., U.S. Pat. No. 4,035,549 and U.S. Patent Publication No. 20030124296.

The sheets comprising the sodium ionomer composition can be produced by any suitable process. For example, the sheets may be formed through dipcoating, solution casting, compression molding, injection molding, lamination, melt extrusion, blown film, extrusion coating, tandem extrusion coating, or by any other procedures that are known to those of skill in the art. Preferably, the sheets are formed by melt extrusion, melt coextrusion, melt extrusion coating, or tandem melt extrusion coating processes.

The invention provides a solar cell module comprising at least one layer that is a sheet (i.e. encapsulant layer) comprising at least one layer of the above-described sodium ionomer composition and a solar cell layer comprised of one or a plurality of solar cells.

The term "solar cell" is meant to include any article which can convert light into electrical energy. Solar cells useful in the invention include, but are not limited to, wafer-based solar cells (e.g., c-Si or mc-Si based solar cells, as described above in the background section) and thin film solar cells (e.g., a-Si, μc-Si, CdTe, or CI(G)S based solar cells, as described above in the background section). Within the solar cell layer, it is preferred that the solar cells are electrically interconnected and/or arranged in a flat plane. In addition, the solar cell layer may further comprise electrical wirings, such as cross ribbons and bus bars.

The solar cell module typically comprises at least one layer of a sheet comprising the sodium ionomer composition, which is laminated to the solar cell layer and serves as an encapsulant layer. By "laminated", it is meant that, within a laminated structure, the two layers are bonded either directly (i.e., without any additional material between the two layers) or indirectly (i.e., with additional material, such as interlayer or adhesive materials, between the two layers). Preferably, the sheet comprising the sodium ionomer composition is directly laminated or bonded to the solar cell layer.

The solar cell module may further comprise additional encapsulant layers comprising other polymeric materials, such as acid copolymers as previously defined herein, ionomers as previously defined herein, poly(ethylene vinyl acetates), poly(vinyl acetals) (including acoustic grade poly(vinyl acetals)), polyurethanes, poly(vinyl chlorides), polyethylenes (e.g., linear low density polyethylenes), polyolefin block elastomers, copolymers of α-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof.

The thickness of the individual encapsulant layers other than the sheet(s) comprising the sodium ionomer composition may independently range from about 1 mil (0.026 mm) to about 120 mils (3 mm), or preferably from about 1 mil to about 40 mils (1.02 mm), or more preferably from about 1 mil to about 20 mils (0.51 mm). Any or all of the encapsulant layer(s) comprised in the solar cell modules may have smooth or rough surfaces. Preferably, the encapsulant layer(s) have rough surfaces to facilitate deaeration during the lamination process.

The solar cell module may further comprise an incident layer and/or a backing layer serving as the outermost layer or layers of the module at the light-receiving side and the non-light-receiving side of the solar cell module, respectively.

The outer layers of the solar cell modules, i.e., the incident layer and the backing layer, may be derived from any suitable sheets or films. Suitable sheets may be glass or plastic sheets, such as polycarbonates, acrylics, polyacrylates, cyclic polyolefins (e.g., ethylene norbornene polymers), polystyrenes (preferably metallocene-catalyzed polystyrenes), polyamides, polyesters, fluoropolymers, or combinations of two or more thereof. In addition, metal sheets, such as aluminum, steel, galvanized steel, or ceramic plates may be utilized in forming the backing layer.

The term "glass" includes not only window glass, plate glass, silicate glass, sheet glass, low iron glass, tempered glass, tempered CeO-free glass, and float glass, but also colored glass, specialty glass (such as those containing ingredients to control solar heating), coated glass (such as those sputtered with metals (e.g., silver or indium tin oxide) for solar control purposes), E-glass, Toroglass, Solex® glass (PPG Industries, Pittsburgh, Pa.) and Starphire® glass (PPG Industries). Such specialty glasses are disclosed in, e.g., U.S. Pat. Nos. 4,615,989; 5,173,212; 5,264,286; 6,150,028; 6,340,646; 6,461,736; and 6,468,934. It is understood, however, that the type of glass to be selected for a particular module depends on the intended use.

Suitable film layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, poly(vinyl chlorides) (e.g., poly(vinylidene chloride)), fluoropolymers (e.g., polyvinyl fluoride, polyvinylidene fluoride, polytetrafluoroethylene, ethylene-tetrafluoroethylene copolymers, etc.) and combinations of two or more thereof. The polymeric film may be bi-axially oriented polyester film (preferably poly(ethylene terephthalate) film) or a fluoropolymer film (e.g., Tedlar®, Tefzel®, and Teflon® films, from E.I. du Pont de Nemours and Company, Wilmington, Del. (DuPont)). Fluoropolymer-polyester-fluoropolymer (e.g., "TPT") films are also preferred for some applications. Metal films, such as aluminum foil, may also be used as the backing layers.

The solar cell module may further comprise other functional film or sheet layers (e.g., dielectric layers or barrier layers) embedded within the module. Such functional layers may be derived from any of the above mentioned polymeric films or those that are coated with additional functional coatings. For example, poly(ethylene terephthalate) films coated with a metal oxide coating, such as those disclosed within U.S. Pat. Nos. 6,521,825 and 6,818,819 and European Patent No. EP1182710, may function as oxygen and moisture barrier layers in the laminates.

If desired, a layer of nonwoven glass fiber (scrim) may also be included between the solar cell layers and the encapsulants to facilitate deaeration during the lamination process or to serve as reinforcement for the encapsulants. The use of such scrim layers is disclosed within, e.g., U.S. Pat. Nos. 5,583,057; 6,075,202; 6,204,443; 6,320,115; and 6,323,416 and European Patent No. EP0769818.

The film or sheet layers positioned to the light-receiving side of the solar cell layer are preferably made of transparent material to allow efficient transmission of sunlight into the solar cells. The light-receiving side of the solar cell layer may sometimes be referred to as a front side and in actual use conditions would generally face a light source. The non-light-receiving side of the solar cell layer may sometimes be referred to as a lower or back side and in actual use conditions would generally face away from a light source. A special film or sheet may be included to serve both the function of an encapsulant layer and an outer layer. It is also conceivable that any of the film or sheet layers included in the module may be in the form of a pre-formed single-layer or multi-layer film or sheet.

If desired, one or both surfaces of the incident layer films and sheets, the backing layer films and sheets, the encapsulant layers and other layers incorporated within the solar cell module may be treated prior to the lamination process to enhance the adhesion to other laminate layers. This adhesion enhancing treatment may take any form known within the art and includes flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof. Also, the adhesion strength may be further improved by further applying an adhesive or primer coating on the surface of the laminate layer(s). For example, U.S. Pat. No. 4,865,711 discloses a film or sheet with improved bondability, which has a thin layer of carbon deposited on one or both surfaces. Other exemplary adhesives or primers may include silanes, poly(allyl amine) based primers (see e.g., U.S. Pat. Nos. 5,411,845; 5,770,312; 5,690,994; and 5,698,329), and acrylic based primers (see e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

In one particular embodiment (now referring to FIG. 1), where the solar cells are derived from wafer-based self supporting solar cell units, the solar cell module (20) may comprise, in order of position from the front light-receiving side to the back non-light-receiving side, (a) an incident layer (10), (b) a front encapsulant layer (12), (c) a solar cell layer (14) comprised of one or more electrically interconnected solar cells, (d) a back encapsulant layer (16), and (e) a backing layer (18), wherein at least one or both of the front and back encapsulant layers (12 and 16) comprise the sodium ionomer composition comprising sheets.

Figure 2:
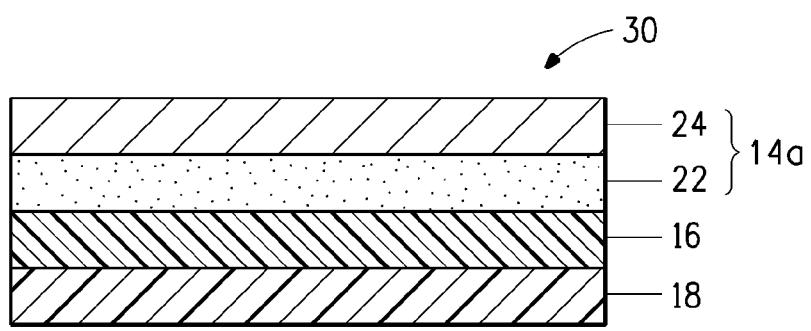
FIG. 2 is a cross-sectional view, not-to-scale, of one particular thin film solar cell module disclosed herein.
Figure 3:
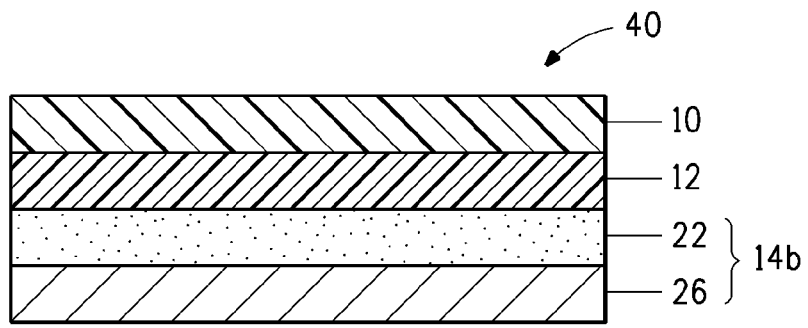
FIG. 3 is a cross-sectional view, not-to-scale, of another thin film solar cell module disclosed herein.

Preferably, however, the solar cell modules are derived from thin film solar cells and may (i) in one embodiment (30 in FIG. 2), comprise, in order of position from the front light-receiving side to the back non-light-receiving side, (a) a solar cell layer (14a) comprising a superstrate (24) and a layer of thin film solar cell(s) (22) deposited thereon at the non-light-receiving side, (b) a (back) encapsulant layer (16) comprising the sodium ionomer composition comprising sheet, and (c) a backing layer (18) or (ii) in a more preferred embodiment (40 in FIG. 3), comprise, (a) a transparent incident layer (10), (b) a (front) encapsulant layer (12) comprising the sodium ionomer comprising sheet, and (c) a solar cell layer (14b) comprising a layer of thin film solar cell(s) (22) deposited on a substrate (26) at the light-receiving side thereof.

Moreover, a series of the solar cell modules described above may be further linked to form a solar cell array, which can produce a desired voltage and current.

Any lamination process known within the art (such as an autoclave or a non-autoclave process) may be used to prepare the solar cell modules.

In an exemplary process, the component layers of the solar cell module are stacked in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., at least about 27-28 in Hg (689-711 mm Hg)), and the sealed bag is placed in an autoclave at a pressure of about 150 to about 250 psi (about 11.3 to about 18.8 bar), a temperature of about 130° C. to about 180° C., or about 120° C. to about 160° C., or about 135° C. to about 160° C., or about 145° C. to about 155° C., for about 10 to about 50 min, or about 20 to about 45 min, or about 20 to about 40 min, or about 25 to about 35 min. A vacuum ring may be substituted for the vacuum bag. One type of suitable vacuum bag is disclosed within U.S. Pat. No. 3,311,517. Following the heat and pressure cycle, the air in the autoclave is cooled without adding additional gas to maintain pressure in the autoclave. After about 20 min of cooling, the excess air pressure is vented and the laminates are removed from the autoclave.

Alternatively, the pre-lamination assembly may be heated in an oven at about 80° C. to about 120° C., or about 90° C. to about 100° C., for about 20 to about 40 min, and thereafter, the heated assembly is passed through a set of nip rolls so that the air in the void spaces between the individual layers may be squeezed out, and the edge of the assembly sealed. The assembly at this stage is referred to as a pre-press.

The pre-press may then be placed in an air autoclave where the temperature is raised to about 120° C. to about 160° C., or about 135° C. to about 160° C., at a pressure of about 100 to about 300 psi (about 6.9 to about 20.7 bar), or preferably about 200 psi (13.8 bar). These conditions are maintained for about 15 to about 60 min, or about 20 to about 50 min, after which the air is cooled while no further air is introduced to the autoclave. After about 20 to about 40 min of cooling, the excess air pressure is vented and the laminated products are removed from the autoclave.

The solar cell modules may also be produced through non-autoclave processes. Such non-autoclave processes are disclosed, e.g., in U.S. Pat. Nos. 3,234,062; 3,852,136; 4,341,576; 4,385,951; 4,398,979; 5,536,347; 5,853,516; 6,342,116; and 5,415,909, U.S. Patent Publication No. 20040182493, European Patent No. EP1235683 B1, and PCT Patent Publication Nos. WO9101880 and WO03057478. Generally, the non-autoclave processes include heating the pre-lamination assembly and the application of vacuum, pressure or both. For example, the assembly may be successively passed through heating ovens and nip rolls.

These examples of lamination processes are not intended to be limiting. Essentially any lamination process may be used.

If desired, the edges of the solar cell module may be sealed to reduce moisture and air intrusion and potential degradative effects on the efficiency and lifetime of the solar cell(s) by any means disclosed within the art. Suitable edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

The invention is further illustrated by the following examples of certain embodiments.

EXAMPLES

The following Examples are intended to be illustrative of the invention, and are not intended in any way to limit the scope of the invention.

Material and Methods

Ionomer Resins:
ION A—ionomer of a copolymer of ethylene and methacrylic acid containing 15 wt % copolymerized units of methacrylic acid, 17% neutralized with zinc ions, MFR of 5.9 g/10 min (as determined in accordance with ASTM D1238 at 190° C., 2.16 kg). The MFR of the precursor ethylene methacrylic acid copolymer, prior to neutralization, was 25 g/10 min (at 190° C., 2.16 kg).

ION B—ionomer of a copolymer of ethylene and methacrylic acid containing 21.7 wt % of copolymerized units of methacrylic acid, 15% neutralized with zinc ions, MFR of 5.4 g/10 min (at 190° C., 2.16 kg). The MFR of the precursor ethylene methacrylic acid copolymer, prior to neutralization, was 23 g/10 min (at 190° C., 2.16 kg).

ION C—ionomer of a copolymer of ethylene and methacrylic acid containing 21.7 wt % of copolymerized units of methacrylic acid, 15% neutralized with sodium ions, MFR of 3.4 g/10 min (at 190° C., 2.16 kg). The MFR of the precursor ethylene methacrylic acid copolymer, prior to neutralization, was 23 g/10 min (at 190° C., 2.16 kg).

ION D—ionomer of a copolymer of ethylene and methacrylic acid containing 21.7 wt % of copolymerized units of methacrylic acid, 20% neutralized with sodium ions, MFR of 2.3 g/10 min (at 190° C., 2.16 kg). The MFR of the precursor ethylene methacrylic acid copolymer, prior to neutralization was 23 g/10 min (at 190° C., 2.16 kg).

ION E—ionomer of a copolymer of ethylene and methacrylic acid containing 21.7 wt % of copolymerized units of methacrylic acid, 25% neutralized with zinc ions, MFR of 1.7 g/10 min (at 190° C., 2.16 kg). The MFR of the precursor ethylene methacrylic acid copolymer, prior to neutralization, was 23 g/10 min (at 190° C., 2.16 kg).

ION F—ionomer of a copolymer of ethylene and methacrylic acid containing 21.7 wt % of copolymerized units of methacrylic acid, 25% neutralized with sodium ions, MFR of 1.5 g/10 min (at 190° C., 2.16 kg). The MFR of the precursor ethylene methacrylic acid copolymer, prior to neutralization, was 23 g/10 min (at 190° C., 2.16 kg).

ION G—ionomer of a copolymer of ethylene and methacrylic acid containing 21.7 wt % of copolymerized units of methacrylic acid, 26% neutralized with sodium ions, MFR of 1.8 g/10 min (at 190° C., 2.16 kg). The MFR of the precursor ethylene methacrylic acid copolymer, prior to neutralization was 23 g/10 min (at 190° C., 2.16 kg).

ION H—ionomer of a copolymer of ethylene and methacrylic acid containing 19 wt % of copolymerized units of methacrylic acid, 39% neutralized with zinc ions, MFR of 4 g/10 min (at 190° C., 2.16 kg). The MFR of the precursor ethylene methacrylic acid copolymer, prior to neutralization was 250 g/10 min (at 190° C., 2.16 kg).

ION I—ionomer of a copolymer of ethylene and methacrylic acid containing 19 wt % of copolymerized units of methacrylic acid, 36% neutralized with zinc ions, MFR of 1 g/10 min (at 190° C., 2.16 kg). The MFR of the precursor ethylene methacrylic acid copolymer, prior to neutralization was 60 g/10 min (at 190° C., 2.16 kg).

ION J—ionomer of a copolymer of ethylene and methacrylic acid containing 19 wt % of copolymerized units of methacrylic acid, 37% neutralized with sodium ions, MFR of 2.6 g/10 min (at 190° C., 2.16 kg). The MFR of the precursor ethylene methacrylic acid copolymer, prior to neutralization was 60 g/10 min (at 190° C., 2.16 kg).

ION K—ionomer of a copolymer of ethylene and methacrylic acid containing 21.7 wt % of copolymerized units of methacrylic acid, 30% neutralized with sodium ions, MFR of 0.9 g/10 min (at 190° C., 2.16 kg). The MFR of the precursor ethylene methacrylic acid copolymer, prior to neutralization was 23 g/10 min (at 190° C., 2.16 kg).

Sheeting Process:

The ionomer resins were fed into 25 mm diameter Killion extruders using the temperature profile set forth in Table 1. The resins were extrusion cast into polymer sheets.

TABLE 1

| Extruder Zone | Temperature (° C.) |
|---|---|
| Feed | Ambient |
| Zone 1 | 100-170 |
| Zone 2 | 150-210 |
| Zone 3 | 170-230 |
| Adapter | 170-230 |
| Die | 170-230 |

The polymer throughput was controlled by adjusting the screw speed to maximum throughput. The extruder fed a 150 mm slot die with a nominal gap of 2 mm. The cast sheet was fed onto a 200 mm diameter polished chrome chill roll held at a temperature of between 10° C. and 15° C. rotating at 1 to 2 rpm. The nominally 0.76 mm (0.030 in) thick sheets were then removed and cut into 300×300 mm squares.

Lamination Process 1 for Glass Laminates:

Annealed glass sheets (100×100×3 mm) were washed with a solution of trisodium phosphate (5 g/l) in de-ionized water at 50° C. for 5 min, then rinsed thoroughly with de-ionized water and dried. Three layers of each respective ionomer sheet (about 0.76 mm thick each) were stacked together and placed between two lites of glass sheet (to yield an interlayer thickness of 2.28 mm). The moisture level of the ionomer sheets was kept below 0.06% by weight by minimizing contact time with the room environment (~35% RH). The pre-lamination assembly was then taped together with polyester tape in several locations to maintain relative positioning of each layer with the glass lites. A nylon fabric strip was placed around the periphery of the assembly to facilitate air removal from within the layers. The assembly was placed inside a nylon vacuum bag, sealed and then a connection was made to a vacuum pump. Vacuum was applied to allow substantial removal of air from within the bagged assembly (air pressure inside the bag was reduced to below 50 millibar absolute). The bagged assembly was then heated in a convection air oven to 120° C. and maintained at these conditions for 30 min. A cooling fan was then used to cool the assembly to near ambient temperature, after which the vacuum source was disconnected and the bag was removed, yielding a fully pre-pressed assembly of glass and interlayer. Although hermetically sealed around the periphery, several areas of the assembly were not fully bonded as indicated by the presence of bubbles in these areas. The assembly was then placed into an air autoclave and the temperature and pressure were increased from ambient to 135° C. at 13.8 bar over 15 min. This temperature and pressure was maintained for 30 min and then the temperature was decreased to 40° C. at Cooling Rate A of 2.5° C./min or Cooling Rate B of 0.1° C./min whereby the pressure was then reduced to ambient over a period of 15 min and the laminates were removed from the autoclave.

Percent Haze Testing:

The glass laminates were thoroughly cleaned using Windex® glass cleaner and lintless cloths to ensure that they were substantially free of bubbles and other defects which might otherwise interfere with making valid optical measurements. The percent haze of each laminates was then determined using a Haze-gard Plus hazemeter (BYK-Gardner, Columbia, Md.) in accordance with American National Standard (ANSI Z26.1-1966) "Safety Code for Safety Glazing Materials for Glazing Motor Vehicles Operating on Land Highways."

Lamination Process 2 for Solar Cell Modules:

The component layers of the laminate are stacked to form a pre-lamination assembly. For the assembly containing a polymeric film layer as the outer surface layer, a cover glass sheet is placed over the film layer. The pre-lamination assembly is then placed within a Meier ICOLAM® 10/08 laminator (Meier laminator; Meier Vakuumtechnik GmbH, Bocholt, Germany). The lamination cycle includes an evacuation step (vacuum of 3 in Hg (76 mm Hg)) of 5.5 min and a pressing stage (pressure of 1000 mbar) of 5.5 min at a temperature of 145° C. The resulting laminate is then removed from the laminator.

Lamination Process 3 for Solar Cell Modules:

The component layers of the laminate are stacked to form a pre-lamination assembly. For an assembly containing a polymeric film layer as the outer surface layer, a cover glass sheet is placed over the film layer. The pre-lamination assembly is then placed within a vacuum bag, which is sealed and a vacuum is applied to remove the air from the vacuum bag. The bag is placed into an oven and heated to a temperature of about 90° C. to about 100° C. for 30 min to remove air contained within the assembly. The assembly is then subjected to autoclaving at 140° C. for 30 min in an air autoclave to a pressure of 200 psig (14.3 bar). The air is cooled without further introduction of air to the autoclave. After 20 min of cooling and when the air temperature reaches less than about 50° C., the autoclave is vented and the vacuum bag containing the laminated assembly is removed from the autoclave. The resulting laminate is then removed from the vacuum bag.

Comparative Examples CE1-2 and Examples E1-2

Samples CE1-2 and E1-2 were glass laminates prepared by Lamination Process 1, described above. The ionomer interlayer sheets used in each of the laminates were produced by the Sheeting Process, described above, using the ionomer resins listed in Table 2, below. The glass laminates were further subjected to Haze Testing, using the method described above. The results are presented in Table 2.

The results demonstrate that, in general, as the cooling rate decreases, the percent haze increases. The results also demonstrate that, at comparable acid levels (21.7 wt %) and comparable neutralization levels (15%), glass laminates comprising sodium ionomers (E1) exhibit a lower percent haze compared to the glass laminates comprising zinc ionomers (CE2).

TABLE 2

| | | Haze (%) | |
|---|---|---|---|
| Sample No. | Ionomer | Cooling Rate A | Cooling Rate B |
| CE1 | ION A | 31.5 | 98.3 |
| CE2 | ION B | 2.2 | 14.8 |
| E1 | ION C | 1.5 | 12.7 |
| E2 | ION D | 1.1 | 7.2 |

Comparative Example CE3 and Example E3-4

Samples CE3 and E3-4 were glass laminates prepared by Lamination Process 1, described above. The ionomer interlayer sheets used in each of the laminates were produced by the Sheeting Process, described above, using the ionomer resins listed in Table 3, below. The glass laminates were further subjected to Haze Testing, using the method described above. The results are presented in Table 3.

The results demonstrate that, at comparable acid levels (21.7 wt %) and comparable higher neutralization levels (25-26%), glass laminates comprising sodium ionomers (E3-4) exhibit lower haze levels when compared to glass laminates comprising zinc ionomers (CE3).

TABLE 3

| | | Haze (%) | |
|---|---|---|---|
| Sample No. | Ionomer | Cooling Rate A | Cooling Rate B |
| CE3 | ION E | 1.4 | 10.3 |
| E3 | ION F | 0.9 | 4.4 |
| E4 | ION G | 0.8 | 5.2 |

Comparative Examples CE4-6 and Example 5

Samples CE4-6 and E5 were glass laminates prepared by Lamination Process 1, described above. The ionomer interlayer sheets used in each of the laminates were produced by the Sheeting Process, described above, using the ionomer resins listed in Table 4, below. The glass laminates were subjected to Haze Testing, using the method described above. The results are presented in Table 4.

The results demonstrate that glass laminates comprising sodium ionomers (E5) exhibit lower haze levels compared to glass laminates comprising zinc ionomers (CE4-5). In addition, by comparing E5 with CE6, it is shown that a higher acid level in the sodium ionomer (21.7 wt % in E5) can further reduce the haze level thereof.

TABLE 4

| | | Haze (%) | |
|---|---|---|---|
| Sample No. | Ionomer | Cooling Rate A | Cooling Rate B |
| CE4 | ION H | 11.6 | 69.5 |
| CE5 | ION I | 6.4 | 27.4 |
| CE6 | ION J | 1 | 22.5 |
| E5 | ION K | 1 | 3.3 |

Examples E6-25

12×12 in (305×305 mm) solar cell modules described in Table 5 are assembled and laminated by either Lamination Process 2 (Examples E6-15) or Lamination Process 3 (Examples E16-25). Layers 1 and 2 constitute the incident layer and the front-sheet encapsulant layer, respectively, and Layers 4 and 5 constitute the back-sheet encapsulant layer and the back-sheet, respectively, when applicable.

TABLE 5

| | Solar Cell Laminate Structure | | | | |
|---|---|---|---|---|---|
| Sample No. | Layer 1 | Layer 2 | Layer 3 | Layer 4 | Layer 5 |
| E6, 16 | Glass 1 | Ionomer 1 | Solar Cell 1 | | |
| E7, 17 | Glass 2 | Ionomer 2 | Solar Cell 2 | | |
| E8, 18 | | | Solar Cell 3 | Ionomer 4 | Glass 2 |
| E9, 19 | Glass 1 | Ionomer 5 | Solar Cell 4 | ACR 1 | FPF |
| E10, 20 | | | Solar Cell 5 | Ionomer 6 | Glass 2 |
| E11, 21 | Glass 1 | Ionomer 7 | Solar Cell 4 | Ionomer 7 | Glass 3 |
| E12, 22 | Glass 1 | Ionomer 8 | Solar Cell 1 | | |
| E13, 23 | | | Solar Cell 5 | Ionomer 1 | Glass 2 |
| E14, 24 | | | Solar Cell 5 | Ionomer 8 | Glass 2 |
| E15, 25 | Glass 1 | Ionomer 8 | Solar Cell 4 | Ionomer 4 | FPF |

ACR 1 is a 20 mil (0.51 mm) thick embossed sheet derived from ethylene methacrylic acid copolymer containing 18 wt % of copolymerized units of methacrylic acid and having a MFR of 2.5 g/10 min (as determined in accordance with ASTM D1238 at 190° C., 2.16 kg).

FPF is a corona surface treated Tedlar® Tedlar® film (1.5 mil (0.038 mm) thick), a product of E.I. du Pont de Nemours and Co., Inc.

Glass 1 is Starphire® glass from the PPG Corporation.

Glass 2 is a clear annealed float glass plate layer (2.5 mm thick).

Glass 3 in a Solex® solar control glass (3.0 mm thick).

Ionomer 1 is a 60 mil (1.50 mm) thick embossed sheet made from ION K.

Ionomer 2 is a 20 mil (0.51 mm) thick embossed sheet made from ION C.

Ionomer 3 is a 35 mil (0.89 mm) thick embossed sheet made from ION F.

Ionomer 4 is a 20 mil (0.51 mm) thick embossed sheet made from ION D.

Ionomer 5 is a 20 mil (0.51 mm) thick embossed sheet made from ION F.

Ionomer 6 is a 45 mil (1.14 mm) thick embossed sheet made from ION G.

Ionomer 7 is a 20 mil (0.51 mm) thick embossed sheet made from ION G.

Ionomer 8 is a 20 mil (0.51 mm) thick embossed sheet made from ION K.

Solar Cell 1 is a 10×10 in (254×254 mm) a-Si based thin film solar cell with a 125 μm thick stainless steel substrate (U.S. Pat. No. 6,093,581, Example 1).

Solar Cell 2 is a 10×10 in (254×254 mm) CIS based thin film solar cell (U.S. Pat. No. 6,353,042, column 6, line 19).

Solar Cell 3 is a 10×10 in (254×254 mm) CdTe based thin film solar cell (U.S. Pat. No. 6,353,042, column 6, line 49).

Solar Cell 4 is a silicon solar cell made from a 10×10 in (254×254 mm) polycrystalline EFG-grown wafer (U.S. Pat. No. 6,660,930, column 7, line 61).

Solar Cell 5 is a thin film solar cell supported on 12×12 in (305×305 mm) glass sheet (U.S. Pat. Nos. 5,512,107; 5,948,176; 5,994,163; 6,040,521; 6,137,048; and 6,258,620).

What is claimed is:

1. A solar cell module comprising two or more component layers, said component layers comprising a solar cell layer and a sheet comprising at least one layer of a sodium ionomer composition, wherein (a) the solar cell layer is selected from the group consisting of solar cell layers comprising a single solar cell and solar cell layers comprising a plurality of electrically interconnected solar cells; (b) the solar cell layer has a light-receiving side and a non-light-receiving side; and (c) the sodium ionomer composition consists essentially of a sodium ionomer that is an ionic, neutralized derivative of a precursor α-olefin carboxylic acid copolymer, wherein about 25% to about 35% of the total content of the carboxylic acid groups present in the precursor α-olefin carboxylic acid copolymer have been neutralized to form the sodium ionomer, and said sodium ionomer comprises carboxylate groups and counterions, and said counterions consists essentially of sodium ions, and wherein the precursor α-olefin carboxylic acid copolymer comprises (i) copolymerized units of ethylene and (ii) 21 to 23 wt %, based on the total weight of the α-olefin carboxylic acid copolymer, of copolymerized units of an α,β-ethylenically unsaturated carboxylic acid selected from the group consisting of acrylic acids, methacrylic acids, and mixtures of two or more of an acrylic acid and a methacrylic acid; and wherein the sodium ionomer composition does not incorporate a cross-linking additive and is not thermoset during lamination.

2. The solar cell module of claim 1, wherein the precursor α-olefin carboxylic acid copolymer has a melt flow rate of about 60 g/10 min or less, as determined in accordance with ASTM D1238 at 190° C., 2.16 kg, and the sodium ionomer has a melt flow rate of about 10 g/10 min or less, as determined in accordance with ASTM D1238 at 190° C., 2.16 kg.

3. The solar cell module of claim 1, wherein the sodium ionomer has a flexural modulus greater than about 40,000 psi (276 MPa), as determined in accordance with ASTM D638.

4. The solar cell module of claim 1, wherein (i) the precursor α-olefin carboxylic acid copolymer has a melt flow rate of about 25 g/10 min or less, as determined in accordance with ASTM D1238 at 190° C., 2.16 kg; and (ii) the sodium ionomer has a melt flow rate of about 5 g/10 min or less, as determined in accordance with ASTM D1238 at 190° C., 2.16 kg.

5. The solar cell module of claim 1, wherein the sheet comprising the sodium ionomer composition is in the form of a monolayer that consists essentially of the sodium ionomer composition.

6. The solar cell module of claim 1, wherein the sheet comprising the sodium ionomer composition is in the form of a multilayer sheet and has two or more sub-layers, and wherein at least one of the sub-layers consists essentially of the sodium ionomer composition and each of the other sub-layers present in the multilayer sheet comprises at least one polymer selected from the group consisting of acid copolymers, ionomers, poly(ethylene vinyl acetates), poly(vinyl acetals), polyurethanes, polyvinylchlorides, polyethylenes, polyolefin block elastomers, copolymers of an α-olefin and an α,β-ethylenically unsaturated carboxylic acid, silicone elastomers, epoxy resins, and combinations of two or more thereof.

7. The solar cell module of claim 1, wherein the sheet comprising the sodium ionomer composition has a total thickness of about 0.25 to about 1.5 mm.

8. The solar cell module of claim 1, wherein the sheet comprising the sodium ionomer composition has a total thickness of about 0.38 to about 0.89 mm.

9. The solar cell module of claim 1, wherein the sheet comprising the sodium ionomer composition is directly laminated to the solar cell layer.

10. The solar cell module of claim 1, which comprises a front encapsulant layer laminated to the light-receiving side of the solar cell layer and a back encapsulant layer laminated to the non-light-receiving side of the solar cell layer, wherein one of the front and back encapsulant layers is the sheet comprising the sodium ionomer composition recited in claim 1 and the other of the front and back encapsulant layers comprises a polymeric material selected from the group consisting of copolymers of an α-olefin and an α,β-ethylenically unsaturated carboxylic acids, ionomers of copolymers of an α-olefin and an α,β-ethylenically unsaturated carboxylic acid, poly(ethylene vinyl acetates), poly(vinyl acetals), polyurethanes, polyvinylchlorides, polyethylenes, polyolefin block elastomers, copolymers of an α-olefin and an α,β-ethylenically unsaturated carboxylic acid, silicone elastomers, epoxy resins, and combinations thereof.

11. The solar cell module of claim 10, which comprises two of the sheets comprising the sodium ionomer composition, wherein each of the front and back encapsulant layers is one of the two sodium ionomer comprising sheets.

12. The solar cell module of claim 1, further comprising an incident layer, wherein the incident layer is an outermost surface layer of the module and is positioned on the light-receiving side of the solar cell layer.

13. The solar cell module of claim 1, further comprising a backing layer, wherein the backing layer is an outermost surface layer of the module and is positioned on the non-light receiving side of the solar cell layer.

14. The solar cell module of claim 12, wherein the incident layer is selected from the group consisting of (i) glass sheets, (ii) polymeric sheets comprising a polymer selected from the group consisting of polycarbonates, acrylics, polyacrylates, cyclic polyolefins, polystyrenes, polyamides, polyesters, fluoropolymers, and combinations of two or more thereof, and (iii) polymeric films comprising a polymer selected from the group consisting of polyesters, polycarbonate, polyolefins, norbornene polymers, polystyrene, styrene-acrylate copolymers, acrylonitrile-styrene copolymers, polysulfones, nylons, polyurethanes, acrylics, cellulose acetates, cellophane, poly(vinyl chlorides), fluoropolymers, and combinations of two or more thereof.

15. The solar cell module of claim 13, wherein the backing layer is selected from the group consisting of (i) glass sheets, (ii) polymeric sheets, (iii) polymeric films, (iv) metal sheets, and (v) ceramic plates, and wherein the polymeric sheets comprise a polymer selected from the group consisting of polycarbonates, acrylics, polyacrylates, cyclic polyolefins, polystyrenes, polyamides, polyesters, fluoropolymers, and combinations or two or more thereof; and the polymeric films comprise a polymer selected from the group consisting of polyesters, polycarbonates, polyolefins, norbornene polymers, polystyrenes, styrene-acrylate copolymers, acrylonitrile-styrene copolymers, polysulfones, nylons, polyurethanes, acrylics, cellulose acetates, cellophanes, poly(vinyl chlorides), fluoropolymers, and combinations of two or more thereof.

16. The solar cell module of claim 1, wherein the solar cells are wafer-based solar cells selected from the group consisting of crystalline silicon (c-Si) and multi-crystalline silicone (mc-Si) based solar cells.

17. The solar cell module of claim 16, wherein the component layers consist essentially of, in order of position, (i) an incident layer, (ii) a front encapsulant layer laminated to the light-receiving side of the solar cell layer, (iii) the solar cell layer, (iv) a back encapsulant layer laminated to the non-light receiving side of the solar cell layer, and (v) a backing layer, wherein one of the front and back encapsulant layers is the sheet comprising the sodium ionomer composition.

18. The solar cell module of claim 17, which comprises two sheets, each sheet comprising the sodium ionomer composition, wherein each of the front and back encapsulant layers comprises one of the two sheets comprising the sodium ionomer composition.

19. The solar cell module of claim 1, wherein the solar cells are thin film solar cells selected from the group consisting of amorphous silicon (a-Si), microcrystalline silicon (pc-Si), cadmium telluride (CdTe), copper indium selenide (CIS), copper indium/gallium diselenide (GIGS), light absorbing dyes, and organic semiconductors based solar cells.

20. The solar cell module of claim 19, wherein the component layers consist essentially of, in order of position, (i) an incident layer, (ii) a front encapsulant layer comprising the sheet comprising the sodium ionomer composition, and (iii) the solar cell layer, wherein the solar cell layer further comprises a substrate upon which the thin film solar cells are deposited and the substrate is positioned such that the substrate is an outermost surface of the module and is positioned on the non-light-receiving side of the solar cell layer.

21. The solar cell module of claim 19, wherein the component layers consist essentially of, in order of position (i) the solar cell layer, (ii) a back encapsulant layer comprising the sheet comprising the sodium ionomer composition, and (iii) a backing layer, wherein the solar cell layer further comprises a superstrate upon which the thin film solar cells are deposited and the superstrate is positioned such that the superstrate is an outermost surface of the module on the light-receiving side of the solar cell layer.

22. A process for preparing a solar cell module, comprising: (i) providing an assembly comprising the component layers of claim 1 and (ii) laminating the assembly to form the solar cell module.

23. The process of claim 22, wherein the laminating step is conducted by subjecting the assembly to heat.

24. The process of claim 23, wherein the laminating step further comprises subjecting the assembly to vacuum or pressure.

25. A process for preparing a solar cell module, comprising: (i) providing an assembly comprising the component layers of claim 17 and (ii) laminating the assembly to form the solar cell module.

26. A process for preparing a solar cell module, comprising: (i) providing an assembly comprising the component layers of claim 20 and (ii) laminating the assembly to form the solar cell module.

27. A process for preparing a solar cell module, comprising: (i) providing an assembly comprising the component layers of claim 21 and (ii) laminating the assembly to form the solar cell module.

* * * * *